US012604637B2

(12) United States Patent (10) Patent No.: US 12,604,637 B2
Liu et al. (45) Date of Patent: Apr. 14, 2026

(54) DISPLAY DEVICE

(71) Applicant: SHENZHEN CHINA STAR OPTOELECTRONICS SEMICONDUCTOR DISPLAY TECHNOLOGY CO., LTD., Shenzhen (CN)

(72) Inventors: Yifei Liu, Shenzhen (CN); Taijiun Hwang, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 1142 days.

(21) Appl. No.: 17/623,560

(22) PCT Filed: Dec. 24, 2021

(86) PCT No.: PCT/CN2021/141260
§ 371 (c)(1),
(2) Date: Jun. 22, 2023

(87) PCT Pub. No.: WO2023/108798
PCT Pub. Date: Jun. 22, 2023

(65) Prior Publication Data
US 2024/0040902 A1 Feb. 1, 2024

(30) Foreign Application Priority Data

Dec. 17, 2021 (CN) .......................... 202111555270.5

(51) Int. Cl.
| *H10K 59/00* | (2023.01) |
| *H05K 5/03* | (2006.01) |
| *H10K 59/80* | (2023.01) |

(52) U.S. Cl.
CPC ........... *H10K 59/8722* (2023.02); *H05K 5/03* (2013.01)

(58) Field of Classification Search
CPC ........... H10K 59/8722; H10K 59/8791; H10K 2102/311; H05K 5/03
See application file for complete search history.

(56) References Cited

U.S. PATENT DOCUMENTS

2017/0293151 A1* 10/2017 Zha ................... G02F 1/133528
2018/0029347 A1 2/2018 Xing et al.
(Continued)

FOREIGN PATENT DOCUMENTS

CN 102789013 A 11/2012
CN 105741682 A 7/2016
(Continued)

OTHER PUBLICATIONS

Chinese Office Action issued in corresponding Chinese Patent Application No. 202111555270.5 dated May 7, 2023, pp. 1-8.
(Continued)

*Primary Examiner* — Md K Talukder
(74) *Attorney, Agent, or Firm* — PV IP PC; Peter Stecher; Wei Te Chung

(57) ABSTRACT

The present application provides a display device includes: a display panel; at least one function film disposed on at least one side of a display panel, wherein each of the function film includes a first magnetic unit; wherein display device further includes a second magnetic unit located between the display panel and each function film. The second magnetic unit is securely connected to the display panel and has a magnetic attraction force between the second magnetic unit and the first magnetic unit. The display panel is slidably connected to the function film through the second magnetic unit.

19 Claims, 4 Drawing Sheets

(56)　　　　　　References Cited

U.S. PATENT DOCUMENTS

| | | | | |
|---|---|---|---|---|
| 2018/0150102 A1* | 5/2018 | Lee | ........................ | G06F 3/1423 |
| 2018/0186119 A1* | 7/2018 | Yang | ........................ | B32B 7/025 |
| 2018/0341142 A1* | 11/2018 | Choi | ..................... | G06F 1/1643 |
| 2021/0407333 A1* | 12/2021 | He | ........................... | G09F 9/301 |
| 2023/0240108 A1* | 7/2023 | Kim | ........................ | G09F 9/3026 |
| 2023/0335654 A1* | 10/2023 | Sun | ........................ | H10F 77/215 |
| 2024/0040902 A1* | 2/2024 | Liu | .................... | H10K 59/8722 |

FOREIGN PATENT DOCUMENTS

| | | | |
|---|---|---|---|
| CN | 107578705 A | 1/2018 |
| CN | 108153024 A | 6/2018 |
| CN | 108766982 A | 11/2018 |
| CN | 109493737 A | 3/2019 |
| CN | 109848278 A | 6/2019 |
| CN | 111063261 A | 4/2020 |
| CN | 112863336 A | 5/2021 |
| JP | 6091029 B1 | 3/2017 |
| WO | 2021104109 A1 | 6/2021 |

OTHER PUBLICATIONS

International Search Report in International application No. PCT/CN2021/141260, mailed on Aug. 31, 2022.
Written Opinion of the International Search Authority in International application No. PCT/CN2021/141260, mailed on Aug. 31, 2022.

* cited by examiner

DISPLAY DEVICE

FIELD OF INVENTION

The present application relates to a field of display technologies, especially to a display device.

BACKGROUND OF INVENTION

Organic light emitting diode (OLED) display device is also known as organic electroluminescence display device and organic light emitting diode semiconductor. An OLED display device has advantages such as flexible, bendable, low voltage requirement, high power saving efficiency, fast response, light weight, thinness, simple structure, low cost, wide viewing angle, almost infinitely high contrast, low power consumption, extremely high response speed, etc., and has become one of the most important display technologies today.

In a conventional flexible OLED display device, an optically clear adhesive (OCA) is usually used to attach and fix a function film. The function film comprises a module material such as a cover window (CW). The OCA adhesive, during flexibly bending and rolling, generally causes cavitation, and forms a cavity in film layers to result in rupture of the film layers and peeling among the film layers of the display device. Also, film layer peeling further increases possibility of rupture of the film layer and lowers reliability and yield rate of the display device, which increases a manufacturing cost. Such issue urgently needs a solution.

SUMMARY OF INVENTION

Technical Issue

The present application provides a display device that can ease bending stresses among film layers of a display device during bending, eliminate an issue of peeling and rupture of the film layers, and improve reliability and yield rate of the display device.

Technical Solution

An embodiment of the present application provides a display device, the display device comprises:

a display panel; and at least one function film disposed on at least one side of the display panel, wherein each function film comprises a first magnetic unit;

wherein the display device further comprises a second magnetic unit located between the display panel and each of the function film, the second magnetic unit is securely connected to the display panel, and a magnetic attraction force is formed between the second magnetic unit and the first magnetic unit disposed on a same side of the display panel, and the display panel is slidably connected to the function film through the second magnetic unit.

Optionally, the function film comprises a first function film, the first function film is a cover window disposed on a side of the display panel, the cover window comprises a cover window body and the first magnetic unit on two sides of the cover window body, the first magnetic unit is securely connected to the cover window body, and a perpendicular projection of the first magnetic unit on the display panel is located in a non-display region of the display panel.

Optionally, the first magnetic unit is made of a metal material and has a metal mesh structure.

Optionally, a number of metal meshes of the first magnetic unit is x, wherein $500 \leq x \leq 1000$.

Optionally, the second magnetic unit is disposed between the display panel and the first function film, a perpendicular projection of the second magnetic unit on the display panel is located in the non-display region of the display panel, and a perpendicular projection of the second magnetic unit on the first function film covers the first magnetic unit.

Optionally, the second magnetic unit is a first magnetic ink layer, the first magnetic ink layer comprises a light shielding ink and a magnetic powder doped in the light shielding ink, and a diameter of the magnetic powder is y, wherein $0.5 \ \mu m \leq y \leq 50 \ \mu m$.

Optionally, the display device comprises a polarizer disposed between the display panel and the first function film, and the polarizer comprises a polarizer body and the second magnetic unit disposed on a periphery of the polarizer body.

Optionally, the display device further comprises a backplate disposed on another side of the display panel, the function film comprises a second function film, the second function film is a metal support layer disposed on a side of the backplate away from the display panel, and the metal support layer is patterned to form the first magnetic unit.

Optionally, the second magnetic unit is disposed between the backplate and the second function film, the second magnetic unit is a second magnetic ink layer, and a perpendicular projection of the second magnetic ink layer on the second function film covers the first magnetic unit.

Optionally, the display device comprises a bending axis and two opposite side edges perpendicular to the bending axis, a sliding direction of the display panel relative to the function film is the same as an extending direction of the side edges, wherein hemming units are disposed on the side edges respectively.

Advantages

The display device provided by the present application, through the mutually attracting first magnetic unit and second magnetic unit, makes the function film including the first magnetic unit be slidably connected to the display panel securely connected to the second magnetic unit to prevent the issue of peeling of the film layers resulting from the display panel and the function films connected by optically clear adhesive. Also, the way of slidable connection makes the display panel and the function films have a certain degree of freedom to effectively improve stability and yield rate of the display panel and lower a manufacturing cost.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

DETAILED DESCRIPTION OF PREFERRED EMBODIMENTS

Figure 1:
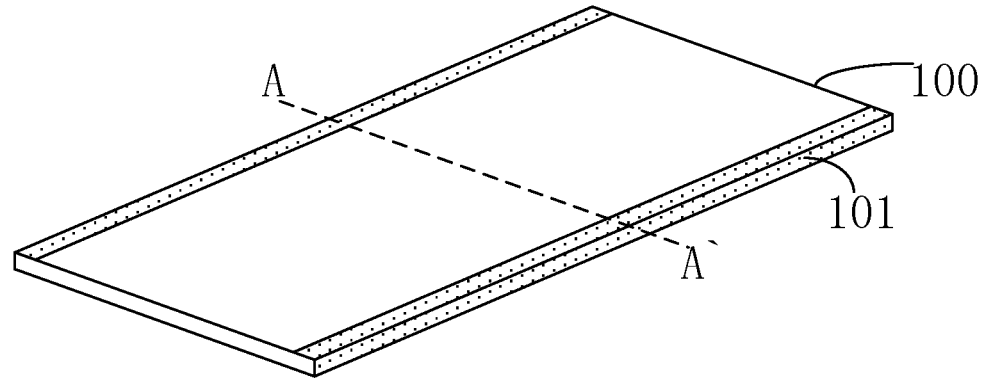
FIG. 1 shows a schematic perspective structural view of a display device provided by a first embodiment of the present application.

The technical solution in the embodiment of the present application will be clearly and completely described below with reference to the accompanying drawings in the embodiments of the present application. Apparently, the described embodiments are merely some embodiments of the present application instead of all embodiments. According to the embodiments in the present application, all other embodiments obtained by those skilled in the art without making any creative effort shall fall within the protection scope of the present application. In addition, it should be understood that the specific embodiments described here are only used to illustrate and explain the present application, and are not used to limit the present application. In the present application, the used orientation terminologies such as "upper" and "lower", when are not specified to the contrary explanation, usually refer to the upper and lower states of the device in actual use or working conditions, specifically according to the direction of the figures in the drawings. Furthermore, "inner" and "outer" refer to the outline of the device.

The following disclosure provides many different embodiments or examples to achieve different structures of the present application. To simplify the disclosure of the present application, the components and arrangements of the specific examples are described below. Of course, they are merely examples, and the purpose is not to limit the present application. Furthermore, the present application may repeat reference numerals and/or reference letters in different examples. The repetition is for the purpose of simplification and clarity, and does not by itself indicate the relationship between the various embodiments and/or settings discussed. In addition, the present application provides examples of various specific processes and materials, but a person of ordinary skill in the art can be aware of the application of other processes and/or the use of other materials. The followings are described in detail respectively. It should be explained that the following description order of the embodiments has no limit a preferred order of the embodiments.

First Embodiment

An embodiment of the present application provides a display device, the display device comprises: a display panel; and at least one function film disposed on at least one side of the display panel, wherein each function film comprises a first magnetic unit; wherein the display device further comprises a second magnetic unit located between the display panel and each of the function film, the second magnetic unit is securely connected to the display panel, and a magnetic attraction force is formed between the second magnetic unit and the first magnetic unit disposed on a same side of the display panel, and the display panel is slidably connected to the function film through the second magnetic unit.

The display device provided by the present application, through the mutually attracting first magnetic unit and second magnetic unit, makes the function film including the first magnetic unit be slidably connected to the display panel securely connected to the second magnetic unit to prevent the issue of peeling of the film layers resulting from the display panel and the function films connected by optically clear adhesive. Also, the way of slidable connection makes the display panel and the function films have a certain degree of freedom to effectively improve stability and yield rate of the display panel and lower a manufacturing cost.

In the present embodiment, the first magnetic unit and the second magnetic unit have a magnetic attraction force therebetween, and mutually attract each other such that the display panel and the function film can bonded together more tightly to prevent using optically clear adhesive to adhering and fixing the display panel and function film. However, the present application has no limit the way of magnetically attraction between the first magnetic unit and the second magnetic unit, they, for example, can be achieved by any combination of single magnet, magnetic attraction track, rubber magnetic bar, magnetic suspension liquid, magnetic powder, magnetic ink, and metal structure.

In particular, the display device is a flexible display device, and its type can be flexible OLED display device, flexible micro light emitting diode (Micro LED) display device, or flexible mini light emitting diode (Mini LED) display device. Preferably, the display device is a flexible OLED display device, and a display panel type in the flexible OLED display device is a flexible OLED display panel.

FIG. 1 shows a schematic perspective structural view of a display device provided by a first embodiment of the present application. With reference to FIG. 1, in the present embodiment, the display device 100 comprises a bending axis AA'. The display device 100 is able to bend freely along the bending axis AA'. It should be explained that the display device 100 can be a folding display device or a rolling display device. The bending axis of the display device 100 can be single or plural. When the bending axis of the display device 100 is plural, the bending axis of the display device 100 comprises a bending axis AA' and other bending axis parallel to the bending axis AA'.

Figure 2:
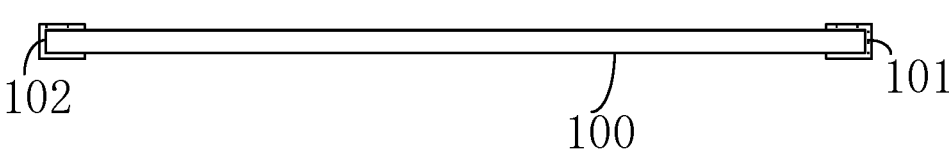
FIG. 2 shows a schematic cross-sectional view of the display device provided by a first embodiment of the present application along line AA'.

FIG. 2 shows a schematic cross-sectional view of the display device provided by a first embodiment of the present application along line AA'. With reference to FIGS. 1 and 2, in the present embodiment, the display device 100 further comprises two opposite side edges 102 perpendicular to the bending axis AA'. Hemming units 101 are disposed on the two side edges 102 respectively. The hemming units 101 are configured to limit positions of the function film and the display panel, and cover the two side edges 102 and two edges of the display device 100 adjacent to the two side edges 102. The hemming units 101 are both located in a non-display region of the display device 100 to prevent lowering a screen ratio of the display device 100. The hemming unit 101 limits a sliding direction of the function film relative to the display panel such that the sliding direction of the function film relative to the display panel is the same as an extending direction of the side edges 102, which effectively prevents an issue of film layer dislocation in an extending direction of the display device 100 along the bending axis AA' due to slidable connection between the display panel and the function film.

The hemming unit 101 has flexibility. In the present embodiment, a material of the hemming unit 101 is rubber, the hemming unit 101 employs a rubber material to facilitate bending of the display device 100, and also to perform a cushioning and anti-vibration function to the display device 100.

In the present embodiment, the function film of the display device 100 can be single and can be plural. When the function film is plural, the function films can be disposed on two sides of the display device 100 respectively. The display device 100 including a plurality of function films is taken as an example for explanation as follows.

Figure 3:
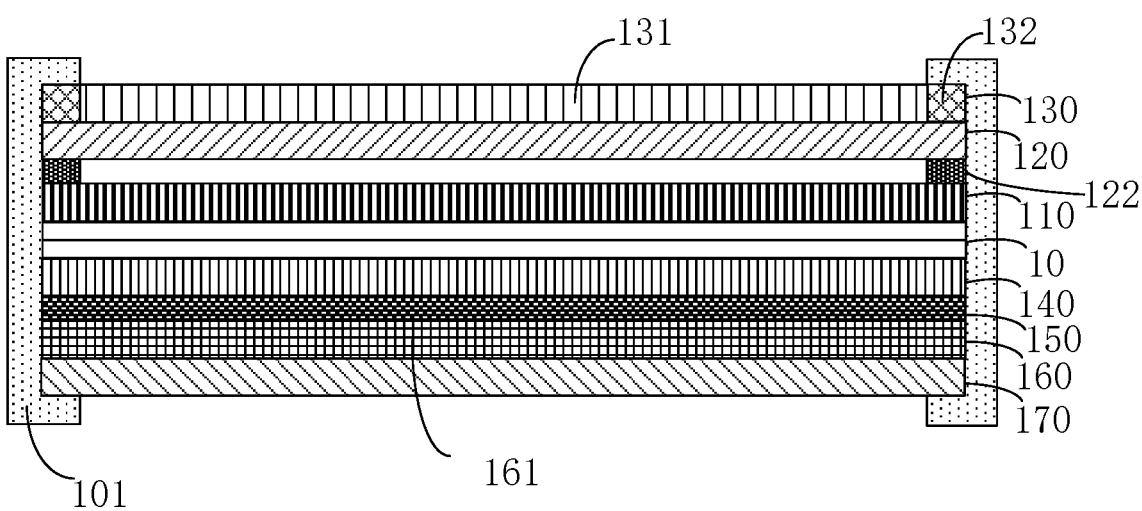
FIG. 3 is a schematic structural view of film layers of the display device provided by the first embodiment of the present application.
Figure 4:
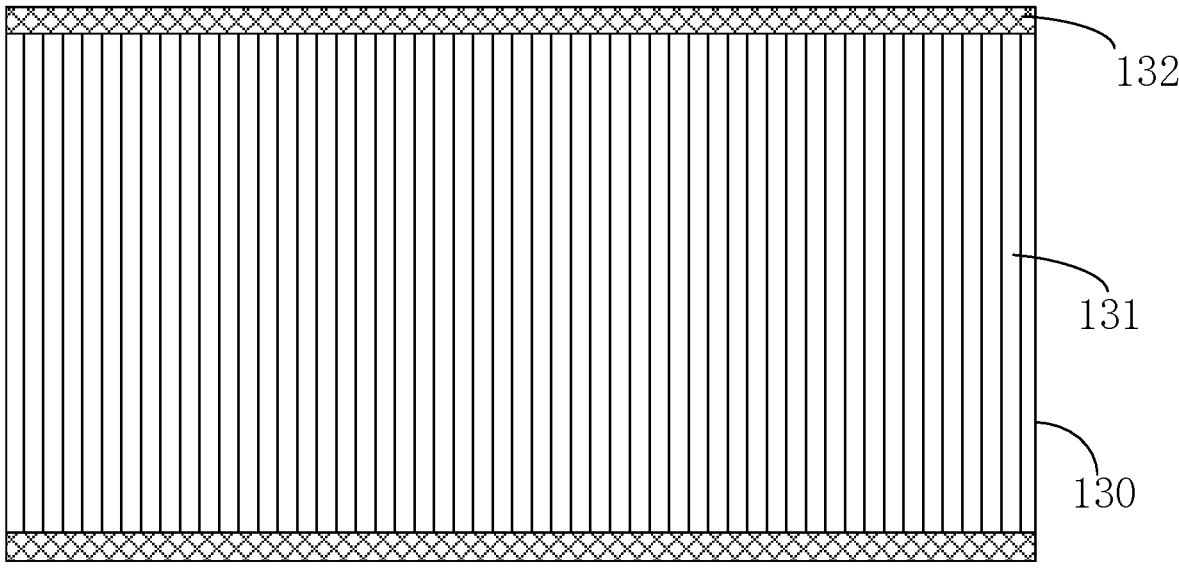
FIG. 4 shows a top view of a first function film provided by the first embodiment of the present application.
Figure 5:
FIG. 5 shows a top view of a second magnetic unit provided by the first embodiment of the present application.
Figure 6:
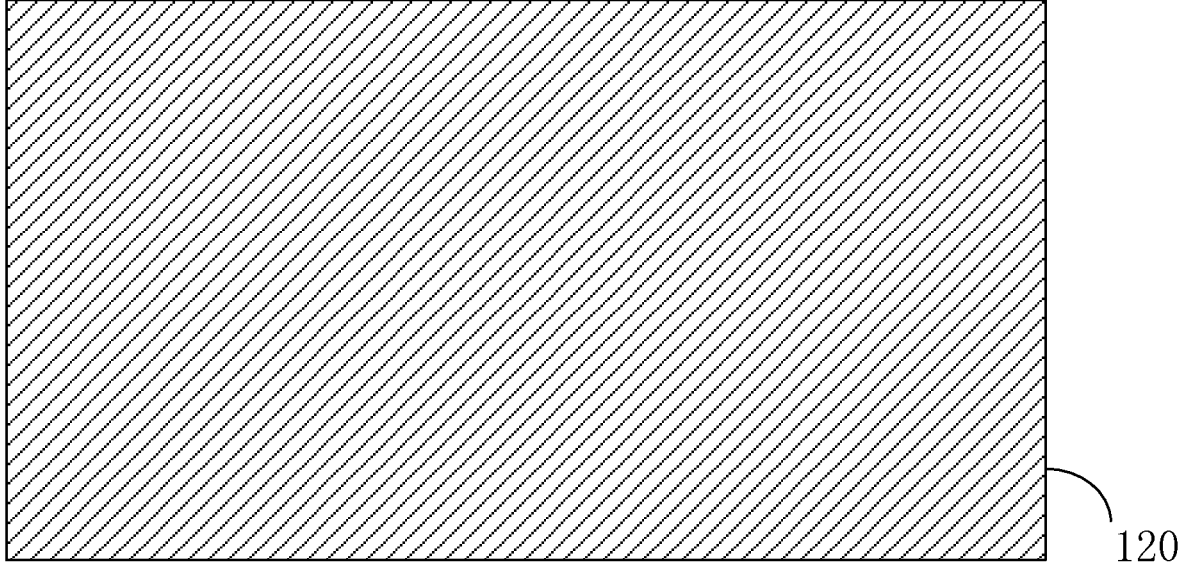
FIG. 6 shows a schematic structural view of a polarizer provided by the first embodiment of the present application.

FIG. 3 is a schematic structural view of film layers of the display device provided by the first embodiment of the present application. FIG. 4 shows a top view of a first function film provided by the first embodiment of the present application. FIG. 5 shows a top view of a second magnetic unit provided by the first embodiment of the present application. FIG. 6 shows a schematic structural view of a polarizer provided by the first embodiment of the present application. With reference to FIGS. 1 to 6, the display device provided by the first embodiment of the present application 100 comprises: display panel 10, the display panel 10, for example, comprises: a driver circuit layer and a light emission function layer located on the driver circuit layer. The display device 100 further comprises a first function film 130 and a second function film 160 disposed on two sides of the display panel 10. The first function film 130 comprises a first magnetic unit 132, and a second magnetic unit 122 is disposed between the first function film 130 and the display panel 10. A magnetic attraction force is formed between the first magnetic unit 132 and the second magnetic unit 122. The second function film 160 comprises a first magnetic unit 161, and a second magnetic unit 150 is disposed between the second function film 160 and the display panel 10. A magnetic attraction force is formed between the first magnetic unit 161 and the second magnetic unit 150.

In the present embodiment, the display panel 10 comprises a first side and a second side, wherein an encapsulation layer 110, a second magnetic unit 122, a polarizer 120, and a first function film 130 are sequentially stacked on the first side of the display panel 10. A backplate 140, a second magnetic unit 150, a second function film 160, and a buffer layer 170 are sequentially stacked on the second side of the display panel 10.

In the present embodiment, the first function film 130 is a cover window disposed on a first side of the display panel 10. The cover window, for example, is disposed on an outermost side of the display device 100 to protect the display panel 10 from external invasion. The cover window comprises the first magnetic unit 132. In particular, the cover window comprises a cover window body 131 and the first magnetic unit 132 on two sides of the cover window body 131. The first magnetic unit 132 and the cover window body 131 are disposed adjacent to each other and are securely connected to each other in the same layer, and a perpendicular projection of the first magnetic unit 132 on the display panel 10 is located in the non-display region of the display panel 10.

In the present embodiment, because the first magnetic unit 132 and the cover window body 131 are disposed adjacent to each other in the same layer, an entire thickness of the cover window would not increase such that thinness of the display device 100 can be achieved. Furthermore, a perpendicular projection of the first magnetic unit 132 on the display panel 10 is located in the non-display region of the display panel 10 such that the first magnetic unit 132 would not lower a display area of the display panel 10, which guarantees a ratio of the display region of the display device 100.

In the present embodiment, the first magnetic unit 132 and the hemming unit 101 are disposed on the same side. An extending direction of the first magnetic unit 132 is the same as an extending direction of the side edges perpendicular to the bending axis AA'.

In the present embodiment, the cover window body 131 is a flexible organic material, ultra-thin glass, or other bendable material. the first magnetic unit 132 is made of a metal material and has a metal mesh structure. Setting the first magnetic unit 132 as a metal mesh structure including hollow portions can effectively lower difficulty bonding the first magnetic unit 132 and the cover window body 131, which lowers a manufacturing cost. In particular, the first magnetic unit 132 is fixed on the two sides of the cover window body 131 by embedding into metal meshes. Also, the metal mesh structure included by the first magnetic unit 132 can offset a bending stress by the mesh structure during bending of the display device 100 to improve a bending capability of the display device 100. Preferably, considering factors of processes and performance, a number of the metal meshes is x, wherein $500 \leq x \leq 1000$, the number is a mesh number of the meshes per square centimeter. The more the mesh number is, the more the mesh eyes of the first magnetic unit 132 in a unit area is. controlling the number of the metal meshes in the first magnetic unit 132 in a range of 500 to 1000 can make a ratio of an are apertures to an area of metal in the first magnetic unit 132 reach a certain balance while the first magnetic unit 132 has an excellent bending capability, which guarantees a magnetic attraction intensity between the first magnetic unit 132 and second magnetic unit 122, and also prevents an increased material cost due to excessive larger number of the meshes in a unit area and effectively controls the cost.

In the present embodiment, the second magnetic unit 122 is a first magnetic ink layer disposed between the display panel 10 and the cover window. A perpendicular projection of the first magnetic ink layer on the display panel 10 is located in the non-display region of the display panel 10, and a perpendicular projection of the first magnetic ink layer on the cover window covers the first magnetic unit 132. Because the perpendicular projection of the first magnetic ink layer on the display panel 10 is located in the non-display region of the display panel 10, disposing the first magnetic ink layer would not reduce a screen ratio of the display device 100. Furthermore, because the perpendicular projection of the first magnetic ink layer on the cover window covers the first magnetic unit 132, first magnetic unit 132 located on the two sides of the cover window body 131 can generate a magnetic attraction force with the first magnetic ink layer, which makes the display panel 10 able to slide along the extending direction of the side edges relative to the cover window during bending while guaranteeing stable engagement of the cover window and the display panel 10, improves a bending capability of the display device 100. In particular, the perpendicular projection of the first magnetic ink layer on the display panel 10 is located on four edges of the display panel 10 and corresponds to the non-display region of the display panel 10.

In the present embodiment, the first magnetic ink layer comprises a light shielding ink and a magnetic powder doped in the light shielding ink. a diameter of the magnetic powder is y, wherein 0.5 μm≤y≤50 μm. because an initial state of the light shielding ink is a liquid state, the magnetic powder configured to generate a magnetic attraction force with the first magnetic unit 132 is formed in the light shielding ink by a doping process such that the magnetic powder can be evenly distributed in the light shielding ink to guarantee uniformity of an attraction force between the second magnetic unit 122 and the first magnetic unit 132. Further, the diameter of the magnetic powder also directly affects a magnetic attraction intensity between a singe one of the magnetic powder and the first magnetic unit 132 and a thickness of the first magnetic ink layer. Controlling the diameter of the magnetic powder in a range of 0.5 μm to 50 μm can control the thickness of the first magnetic ink layer in a reasonable range while guaranteeing the attraction intensity between the first magnetic unit 132 and the second magnetic unit 122, to prevent an excessive entire thickness of the display device 100 due to disposing of the first magnetic ink layer, which facilitates thinness of the display device 100. Preferably, the thickness of the first magnetic ink layer is equal to the diameter of the magnetic powder. Further, the light shielding ink in the first magnetic ink layer, for example, is black. In the display panel 10, metal wirings are generally disposed in the non-display region of the display panel 10. Because the color of the light shielding ink is black, the first magnetic ink layer, while mutually attracting the first magnetic unit 132, also performs a function of shielding the metal wirings in the non-display region of the display panel 10.

In the present embodiment, the first magnetic ink layer, for example, is formed by a printing process. However, the present embodiment has not limit to the way of formation of the first magnetic ink layer. In other embodiment of the present application, the first magnetic ink layer can also be formed by a coating process.

In the present embodiment, the first magnetic ink layer is an individually disposed film layer, and the first magnetic ink layer is located between the display panel 10 and the polarizer 120.

In the present embodiment, the display device 100, for example, further comprises an encapsulation layer 110. The encapsulation layer 110 is disposed between the display panel 10 and the polarizer 120 and is configured to prevent invasion of external water or oxygen to the display panel 10. The encapsulation layer 110 can be formed by laminated organic encapsulation layers and inorganic encapsulation layers. The first magnetic ink layer is specifically between the encapsulation layer 110 and the polarizer 120.

It should be explained that the present application has no limit to a location of the individually disposed second magnetic unit 122. In other embodiment of the present application, the second magnetic unit 122, for example, can also be disposed between the polarizer 120 and the first function film 130 to reduce a distance between the second magnetic unit 122 and the first magnetic unit 132 to further improve the magnetic attraction force between the second magnetic unit 122 and the first magnetic unit 132.

In the present embodiment, the second function film 160 is a metal support layer (metal sheet, MS) disposed on the second side of the display panel 10. The second side of the display panel 10 is a side of the display panel 10 away from the first function film 130. In particular, the display device 100 further comprises a backplate (BP) 140 located on a side of the display panel 10 away from the first function film 130. The backplate 140 is configured to carry the display panel 10. The metal support layer is disposed on a side of the backplate 140 away from the display panel 10.

In the present embodiment, the metal support layer comprises a first magnetic unit 161. The first magnetic unit 161 is formed by patterning the metal support layer.

In particular, the first magnetic unit 161 is made of a metal material forming the metal support layer and has a metal mesh structure. The perpendicular projection of the first magnetic unit 161 of the mesh structure on the display panel 10 can be located in the display region and/or the non-display region of the display panel 10. This is because the second side of the display panel 10 is a backlight and no display requirement exists thereon. Thus, the perpendicular projection of the first magnetic unit 161 on the display panel 10 not only can be located in the display region of the display panel 10, but also can be located in the non-display region.

It should be explained that metal support layer is an inherent film layer in the display device 100 to perform a supporting and reinforcing function or a heat dissipation function to the display panel 10, and therefore is generally made of metal including stronger support strength and/or higher heat dissipation effect, such as stainless steel (SUS). Further, many series of stainless steel can be attached directly by magnetic substances. Therefore, the present application employs a self-characteristic of the metal support layer, and directly patterns it to form the first magnetic unit 161, which can prevent increase of an entire thickness of the display device 100 and effectively lower a manufacturing cost of the display device 100. Moreover, the patterned first magnetic unit 161 can also effectively lower a bending stress of the display device 100 and improve a bending capability of the display device 100.

In the present embodiment, the second magnetic unit 150 is disposed between the backplate 140 and the second function film 160. The second magnetic unit 150 is a second magnetic ink layer, a perpendicular projection of the second magnetic ink layer on the second function film 160 covers the first magnetic unit 161 to guarantee a stronger magnetic attraction force between the second magnetic ink layer and the first magnetic unit 161 to prevent using optically clear adhesive and make the display panel 10 able toe slide relative to the second function film 160. In particular, the second magnetic ink layer can be directly coated on a side of the backplate 140 away from the display panel 10 by a coating process. The second magnetic ink layer, for example, comprises a black ink and a magnetic powder doped in the black ink. Preferably, a material of the second magnetic ink layer is the same as a material of the first magnetic ink layer to reduce types of materials and manufacturing cost.

In the present embodiment, the buffer layer 170 is disposed on a side of the metal support layer away from the backplate 140, and the buffer layer 170, for example, is made of foam material.

Second Embodiment

Figure 7:
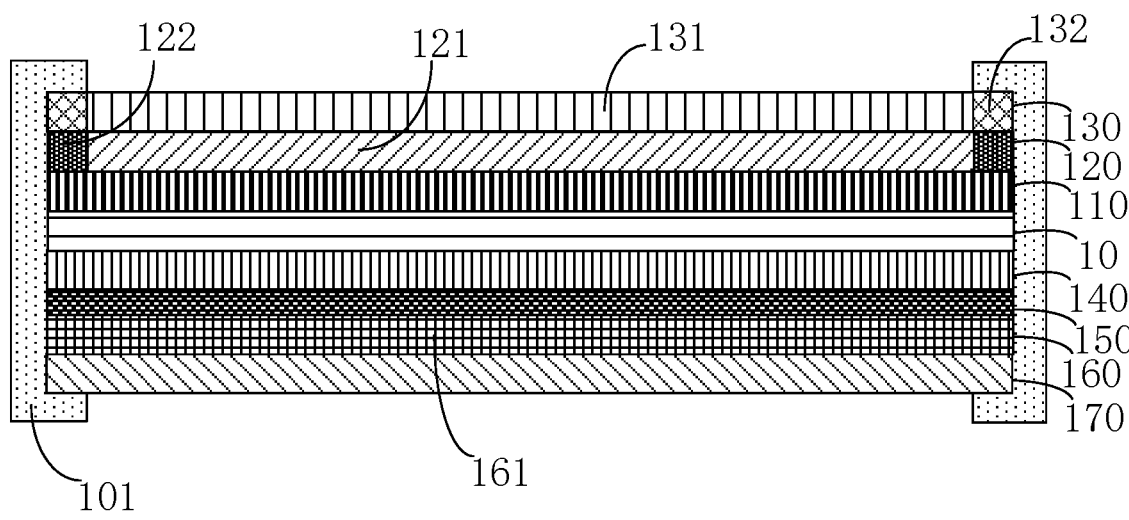
FIG. 7 shows a schematic structural view of film layers of the display device provided by a second embodiment of the present application.
Figure 8:
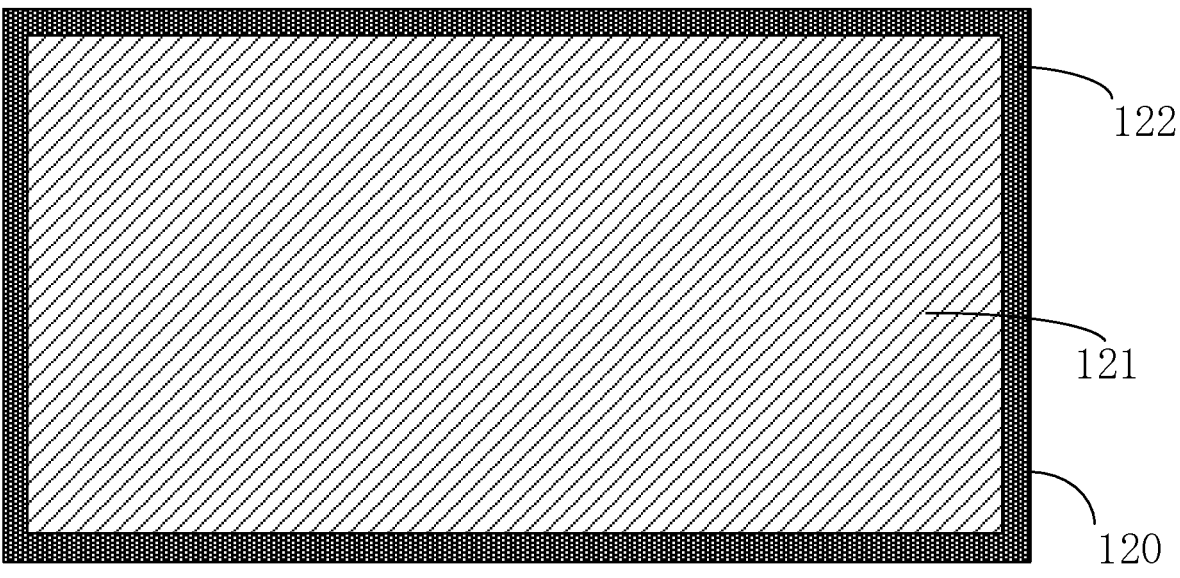
FIG. 8 shows a schematic structural view of the polarizer provided by the second embodiment of the present application.

FIG. 7 shows a schematic structural view of film layers of the display device provided by a second embodiment of the present application. FIG. 8 shows a schematic structural view of the polarizer provided by the second embodiment of the present application. With reference to FIGS. 1, 2, 7, and 8, the second embodiment of the present application provides a display device 100, the display device 100 comprises a display panel 10. The display panel 10 comprises a first side and a second side. An encapsulation layer 110, a polarizer 120, and a first function film 130 are sequentially stacked on the first side of the display panel 10. A backplate 140, a second magnetic unit 150, a second function film 160, and a buffer layer 170 are sequentially stacked on the second side of the display panel 10. Furthermore, the first function film 130 in the display device 100 is the cover window, the cover window comprises a first magnetic unit 13. A second magnetic unit 122, able to generate a magnetic attraction force with the first magnetic unit 132, is disposed between the cover window and the display panel 10. The second magnetic unit 122 is a first magnetic ink layer. Namely, a structure of the display device 100 provided by the second embodiment of the present application is similar to that of the first embodiment, the present embodiment has no repeated description for the same parts.

A difference is that in the display device 100 provided by the second embodiment of the present application, the first magnetic ink layer serving as the second magnetic unit 122 is no longer disposed between the encapsulation layer 110 and the polarizer 120.

In particular, the display device 100 comprises a polarizer 120 disposed between the display panel 10 and the first function film 130. The polarizer 120 comprises a polarizer body 121 and the second magnetic unit 122 disposed on a periphery of the polarizer body 121. The polarizer body 121 corresponds to the display region of the display panel 10. The second magnetic unit 122 corresponds to the non-display region of the display panel 10. In a common OLED display device, the polarizer is usually disposed between the cover window and the display panel to perform a function of reducing environmentally reflected light and improving a display effect of the display panel. The embodiment of the present application retains the polarizer body 121 including the function of reducing environmentally reflected light, and simultaneously forms the second magnetic unit 122 in the polarizer 120 corresponding to the non-display region of the display panel 10 such that an entire thickness of the display device 100 is not increased while mutual attraction between the second magnetic unit 122 and the first magnetic unit 132 is achieved and a bending capability of the display device 100 is improved, to guarantee thinness and visual aesthetics of the display device 100. Also, the second magnetic unit 122 in the polarizer 120 directly contacts the first magnetic unit 132 such that a distance between the second magnetic unit 122 and the first magnetic unit 132 is shortened to further enhance assembling stability of the first function film 130 and display panel 10.

In the present embodiment, a method of cropping the polarizer 120 can be adopted to make the polarizer body 121 have a cutout in a position corresponding to the non-display region of the display panel 10, and the first second magnetic unit 122 is formed in the cutout position. However, the present application has no limit to a position of the second magnetic unit 122 in the polarizer 120. In other embodiment of the present application, the polarizer 120 comprises a plurality of film layers, and positions of at least some of the film layers corresponding to the non-display region of the display panel 10 can be replaced with the second magnetic unit 122.

As described above, the present application provides a display device, the display device comprises: a display panel; at least one function film disposed on at least one side of the display panel, wherein each function film comprises a first magnetic unit; wherein the display device further comprises a second magnetic unit located between the display panel and each of the function film, the second magnetic unit is securely connected to the display panel, and a magnetic attraction force is formed between the second magnetic unit and the first magnetic unit disposed on a same side of the display panel, and the display panel is slidably connected to the function film through the second magnetic unit. The display device provided by the present application, through the mutually attracting first magnetic unit and second magnetic unit, makes the function film including the first magnetic unit be slidably connected to the display panel securely connected to the second magnetic unit to prevent the issue of peeling of the film layers resulting from the display panel and the function films connected by optically clear adhesive. Also, the way of slidable connection makes the display panel and the function films have a certain degree of freedom to effectively improve stability and yield rate of the display panel and lower a manufacturing cost.

The display panel and the display device thereof provided by the embodiment of the present application are described in detail as above. In the specification, the specific examples are used to explain the principle and embodiment of the present application. The above description of the embodiments is only used to help understand the method of the present application and its spiritual idea. Meanwhile, for those skilled in the art, according to the present the idea of invention, changes will be made in specific embodiment and application. In summary, the contents of this specification should not be construed as limiting the present application.

What is claimed is:

1. A display device, wherein the display device comprises:
a display panel; and
at least one function film disposed on at least one side of the display panel, wherein each function film comprises a first magnetic unit;
wherein the display device further comprises a second magnetic unit located between the display panel and each of the function film, the second magnetic unit is securely connected to the display panel, and a magnetic attraction force is formed between the second magnetic unit and the first magnetic unit disposed on a same side of the display panel, and the display panel is slidably connected to the function film through the second magnetic unit;
wherein the function film comprises a first function film, the first function film is a cover window disposed on a side of the display panel, the cover window comprises a cover window body and the first magnetic unit on two sides of the cover window body, the first magnetic unit is securely connected to the cover window body, and a perpendicular projection of the first magnetic unit on the display panel is located in a non-display region of the display panel;
wherein the second magnetic unit is disposed between the display panel and the first function film, a perpendicular projection of the second magnetic unit on the display panel is located in the non-display region of the display panel, and a perpendicular projection of the second magnetic unit on the first function film covers the first magnetic unit;
wherein the second magnetic unit is a first magnetic ink layer, the first magnetic ink layer comprises a light shielding ink and a magnetic powder doped in the light shielding ink, and a diameter of the magnetic powder is y, wherein $0.5 \ \mu m \leq y \leq 50 \ \mu m$.

2. The display device according to claim 1, wherein the first magnetic unit is made of a metal material and has a metal mesh structure.

3. The display device according to claim 2, wherein a number of metal meshes of the first magnetic unit is x, wherein $500 \leq x \leq 1000$.

4. The display device according to claim 1, wherein the display device comprises a polarizer disposed between the display panel and the first function film, and the polarizer comprises a polarizer body and the second magnetic unit disposed on a periphery of the polarizer body.

5. The display device according to claim 1, wherein the display device further comprises a backplate disposed on another side of the display panel, the function film comprises a second function film, the second function film is a metal support layer disposed on a side of the backplate away from the display panel, and the metal support layer is patterned to form the first magnetic unit.

6. The display device according to claim 5, wherein the second magnetic unit is disposed between the backplate and the second function film, the second magnetic unit is a second magnetic ink layer, and a perpendicular projection of the second magnetic ink layer on the second function film covers the first magnetic unit.

7. The display device according to claim 1, wherein the display device comprises a bending axis and two opposite side edges perpendicular to the bending axis, a sliding direction of the display panel relative to the function film is the same as an extending direction of the side edges, wherein hemming units are disposed on the side edges respectively.

8. A display device, wherein the display device comprises:
a display panel; and
at least one function film disposed on at least one side of the display panel, wherein each function film comprises a first magnetic unit;
wherein the display device further comprises a second magnetic unit located between the display panel and each of the function film, the second magnetic unit is securely connected to the display panel, and a magnetic attraction force is formed between the second magnetic unit and the first magnetic unit disposed on a same side of the display panel, and the display panel is slidably connected to the function film through the second magnetic unit;
wherein the display device comprises two function films, the two function films are a first function film and a second function film, the first function film is disposed on a side of the display panel, and the second function film is disposed on another side of the display panel;
wherein the first function film is a cover window disposed on a side of the display panel, the cover window comprises a cover window body and the first magnetic unit on two sides of the cover window body, the first magnetic unit is securely connected to the cover window body, and a perpendicular projection of the first magnetic unit on the display panel is located in a non-display region of the display panel;
wherein the second magnetic unit is disposed between the display panel and the first function film, a perpendicular projection of the second magnetic unit on the display panel is located in the non-display region of the display panel, and a perpendicular projection of the second magnetic unit on the first function film covers the first magnetic unit;
wherein the second magnetic unit is a first magnetic ink layer, the first magnetic ink layer comprises a light shielding ink and a magnetic powder doped in the light shielding ink, and a diameter of the magnetic powder is y, wherein $0.5 \ \mu m \leq y \leq 50 \ \mu m$.

9. The display device according to claim 8, wherein the first magnetic unit is made of a metal material and has a metal mesh structure.

10. The display device according to claim 9, wherein a number of metal meshes of the first magnetic unit is x, wherein $500 \leq x \leq 1000$.

11. The display device according to claim 8, wherein the display device comprises a polarizer disposed between the display panel and the first function film, and the polarizer comprises a polarizer body and the second magnetic unit disposed on a periphery of the polarizer body.

12. The display device according to claim 8, wherein the display device further comprises a backplate disposed on another side of the display panel, the second function film is a metal support layer disposed on a side of the backplate away from the display panel, and the metal support layer is patterned to form the first magnetic unit.

13. The display device according to claim 12, wherein the second magnetic unit is disposed between the backplate and the second function film, the second magnetic unit is a second magnetic ink layer, and a perpendicular projection of the second magnetic ink layer on the second function film covers the first magnetic unit.

14. A display device, wherein the display device comprises:
a display panel; and
at least one function film disposed on at least one side of the display panel, wherein each function film comprises a first magnetic unit;
wherein the display device further comprises a second magnetic unit located between the display panel and each of the function film, the second magnetic unit is securely connected to the display panel, and a magnetic attraction force is formed between the second magnetic unit and the first magnetic unit disposed on a same side of the display panel, and the display panel is slidably connected to the function film through the second magnetic unit;
wherein the display device comprises two function films, the two function films are a first function film and a second function film disposed on the display panel;
wherein the first function film is a cover window disposed on a side of the display panel, the cover window comprises a cover window body and the first magnetic unit on two sides of the cover window body, the first magnetic unit is securely connected to the cover window body, and a perpendicular projection of the first magnetic unit on the display panel is located in a non-display region of the display panel;
wherein the second magnetic unit is disposed between the display panel and the first function film, a perpendicular projection of the second magnetic unit on the display panel is located in the non-display region of the display panel, and a perpendicular projection of the second magnetic unit on the first function film covers the first magnetic unit;
wherein the second magnetic unit is a first magnetic ink layer, the first magnetic ink layer comprises a light shielding ink and a magnetic powder doped in the light shielding ink, and a diameter of the magnetic powder is y, wherein $0.5 \ \mu m \leq y \leq 50 \ \mu m$.

15. The display device according to claim 14, wherein the first magnetic unit is made of a metal material and has a metal mesh structure.

16. The display device according to claim 15, wherein a number of metal meshes of the first magnetic unit is x, wherein $500 \leq x \leq 1000$.

17. The display device according to claim 14, wherein the display device comprises a polarizer disposed between the display panel and the first function film, and the polarizer comprises a polarizer body and the second magnetic unit disposed on a periphery of the polarizer body.

18. The display device according to claim 14, wherein the display device further comprises a backplate disposed on another side of the display panel, the second function film is a metal support layer disposed on a side of the backplate away from the display panel, and the metal support layer is patterned to form the first magnetic unit.

19. The display device according to claim 18, wherein the second magnetic unit is disposed between the backplate and the second function film, the second magnetic unit is a second magnetic ink layer, and a perpendicular projection of the second magnetic ink layer on the second function film covers the first magnetic unit.

\* \* \* \* \*